US009305841B2

(12) United States Patent
Huang et al.

(10) Patent No.: US 9,305,841 B2
(45) Date of Patent: Apr. 5, 2016

(54) METHOD OF PATTERNING A FEATURE OF A SEMICONDUCTOR DEVICE

(71) Applicant: Taiwan Semiconductor Manufacturing Company, Ltd., Hsin-Chu (TW)

(72) Inventors: Yen-Chun Huang, Taichung (TW); Ming-Feng Shieh, Tainan County (TW); Ken-Hsien Hsieh, Taipei (TW); Chih-Ming Lai, Hsinchu (TW); Ru-Gun Liu, Hsinchu County (TW); Tsai-Sheng Gau, HsinChu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/733,661

(22) Filed: Jun. 8, 2015

(65) Prior Publication Data

US 2015/0287635 A1 Oct. 8, 2015

Related U.S. Application Data

(63) Continuation of application No. 13/959,524, filed on Aug. 5, 2013, now Pat. No. 9,054,159.

(60) Provisional application No. 61/783,691, filed on Mar. 14, 2013.

(51) Int. Cl.

| | |
|---|---|
| ***H01L 21/768*** | (2006.01) |
| ***H01L 21/033*** | (2006.01) |
| ***H01L 21/311*** | (2006.01) |

(52) U.S. Cl.

CPC ...... *H01L 21/76892* (2013.01); *H01L 21/0337* (2013.01); *H01L 21/31144* (2013.01); *H01L 21/7684* (2013.01); *H01L 21/76814* (2013.01); *H01L 21/76816* (2013.01); *H01L 21/76877* (2013.01); *H01L 21/76895* (2013.01)

(58) Field of Classification Search

None

See application file for complete search history.

(56) References Cited

U.S. PATENT DOCUMENTS 7,862,962 B2 1/2011 Shieh et al.
7,892,945 B2 * 2/2011 Bedell .................... B82Y 10/00 438/445
7,977,204 B2 * 7/2011 Kim ................. H01L 21/76229 257/E21.548
7,989,355 B2 8/2011 Shieh et al.
8,110,466 B2 2/2012 Shieh et al.

* cited by examiner

*Primary Examiner* — Yasser A Abdelaziez

(74) *Attorney, Agent, or Firm* — Haynes and Boone, LLP

(57) ABSTRACT

A method including forming a trench over a layer disposed on a semiconductor substrate. The trench is filled with a first material to form a filled trench. A feature of a second material is formed over the filled trench. The feature is disposed over the filled trench and extends along two opposing sidewalls of the filled trench to a top surface of the layer. The feature is then planarized to expose a top surface of the filled trench and provide a first portion of the feature adjacent a first sidewall of the two opposing sidewalls of the filled trench and a second portion of the feature adjacent a second sidewall of the two opposing sidewalls of the filled trench. The first and second portions of the feature are used to define a dimension of an interconnect feature disposed over the semiconductor substrate.

20 Claims, 16 Drawing Sheets

METHOD OF PATTERNING A FEATURE OF A SEMICONDUCTOR DEVICE

CROSS-REFERENCE

The present application is a continuation application of U.S. patent application Ser. No. 13/959,524, filed Aug. 5, 2013, entitled "Method of Patterning a Feature of a Semiconductor Device", which will issue as U.S. Pat. No. 9,054,159, and which claims priority to U.S. Provisional Patent Application Ser. No. 61/783,691, filed on Mar. 14, 2013, entitled "Method of Patterning a Feature of a Semiconductor Device," the entire disclosures of which are hereby incorporated herein by reference.

BACKGROUND

The semiconductor integrated circuit (IC) industry has experienced rapid growth. Technological advances in IC materials and designs have produced generations of ICs each having smaller and more complex circuits. In the course of IC evaluation, the geometry size or technology node (e.g., smallest component or line that can be imaged) has decreased. Shrinking technology nodes generally provide benefits by increasing production efficiency and lowering costs. However, these advances have also increased the complexity of fabricating of the circuits. For example, the scaling-down feature sizes can lead to fabrication challenges such as meeting process overlay margins. As the technology nodes shrink, the process overlay margins also shrink—and become more and more critical. One such process where the layout of the device demands alignment of closely-spaced features is in the fabrication of interconnect structures for the IC device. Thus, advances in IC fabrication are needed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. Further, while the present disclosure may present embodiments directed to semiconductor device such as integrated circuits (ICs), one would appreciate that various devices and processes may benefit from the present disclosure including, for example, image sensors, thin film transistor liquid crystal displays (TFT-LCDs), light emitting diodes (LEDs), photomasks, and/or other suitable devices.

Figure 1:
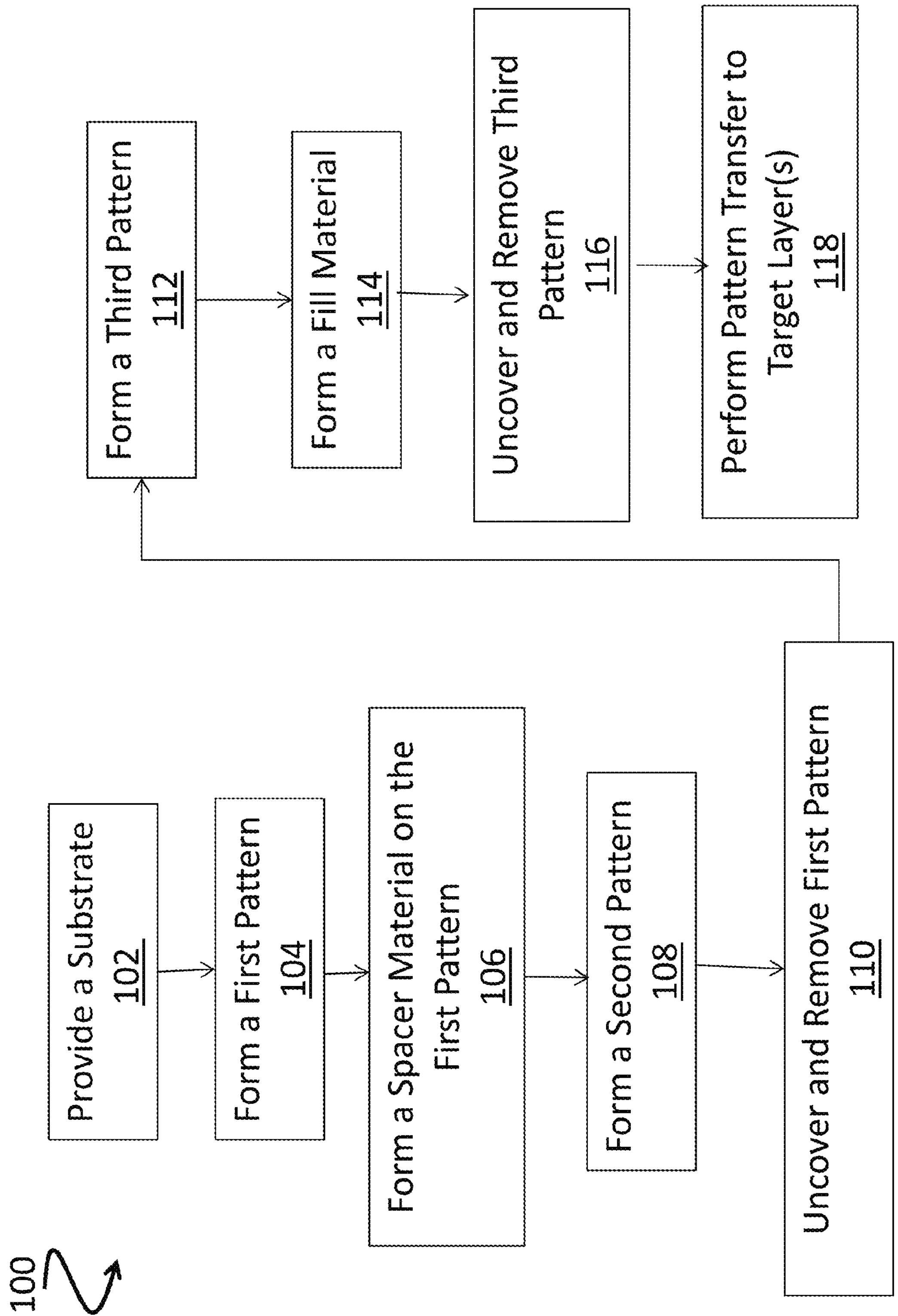
FIG. 1 is an embodiment of a method of fabricating a pattern of features of a semiconductor device according to one or more aspects of the present disclosure.

Illustrated in FIG. 1 is a method 100 of fabricating a pattern of features of a semiconductor device on a substrate. In an embodiment, the pattern of features may be used to form features of an interconnect structure such as a multi-layer interconnect (MLI) structures. For example, the patterns defined by FIG. 1 may be used to form a layer of an MLI structure. FIGS. 2-13, 14*a*, and 14*b* are perspective views of an exemplary embodiment of a device fabricated according to the method 100 of FIG. 1.

It is understood that the method 100 includes steps having features of a complementary metal-oxide-semiconductor (CMOS) technology process flow and thus, are only described briefly herein. Additional steps may be performed before, after, and/or during the method 100. Similarly, one may recognize other portions of a device that may benefit from the doping methods described herein.

It is also understood that parts of the semiconductor device of FIGS. 2 -13, 14*a*, and 14*b* may be fabricated by complementary metal-oxide-semiconductor (CMOS) technology process flow, and thus some processes are only briefly described herein. Further, the semiconductor device may include various other devices and features, such as additional transistors, bipolar junction transistors, resistors, capacitors, diodes, fuses, etc., but is simplified for a better understanding of the inventive concepts of the present disclosure. Furthermore, the device of FIGS. 2-13, 14*a*, and 14*b* may be an intermediate device fabricated during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

The semiconductor device of FIGS. 2-13, 14*a*, and 14*b* includes a plurality of semiconductor devices (e.g., transistors), which may be interconnected. The devices may be interconnected using an interconnect structure formed according the method 100. The interconnect structure may provide a physical and/or electrical connection between devices and/or between a device and a pad providing an external connection (e.g., to a package). An interconnect structure such as an MLI structure includes a plurality of conductive lines formed in various layers (e.g., metal 1, metal 2) with conductive vias interconnecting the lines. Dielectric material is provided in the interconnect structure, for example, interlayer dielectric (ILD) layers to provide isolation between conductive features.

With reference now to FIG. 1, the method 100 begins at block 102 where a substrate is provided. The substrate includes a plurality of layers. The substrate may include a semiconductor wafer having a plurality of layers formed thereon. In an embodiment, the semiconductor wafer is silicon. Alternatively, the substrate may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate is a semiconductor on insulator (SOI). Alternatively, the substrate may include a non-semiconductor material such as a glass substrate, fused quartz substrate, and/or other suitable materials.

The substrate may include various features such as doped regions, dielectric features, conductive features such as multi-layer interconnects, and/or other suitable features. In one embodiment, the substrate includes features forming various semiconductor devices such as, for example, complementary metal-oxide-semiconductor field effect transistors (CMOSFET), imaging sensors, capacitors, memory cells, diodes, fin-type field-effect transistors (FINFETs), and/or other suitable devices.

Figure 2:
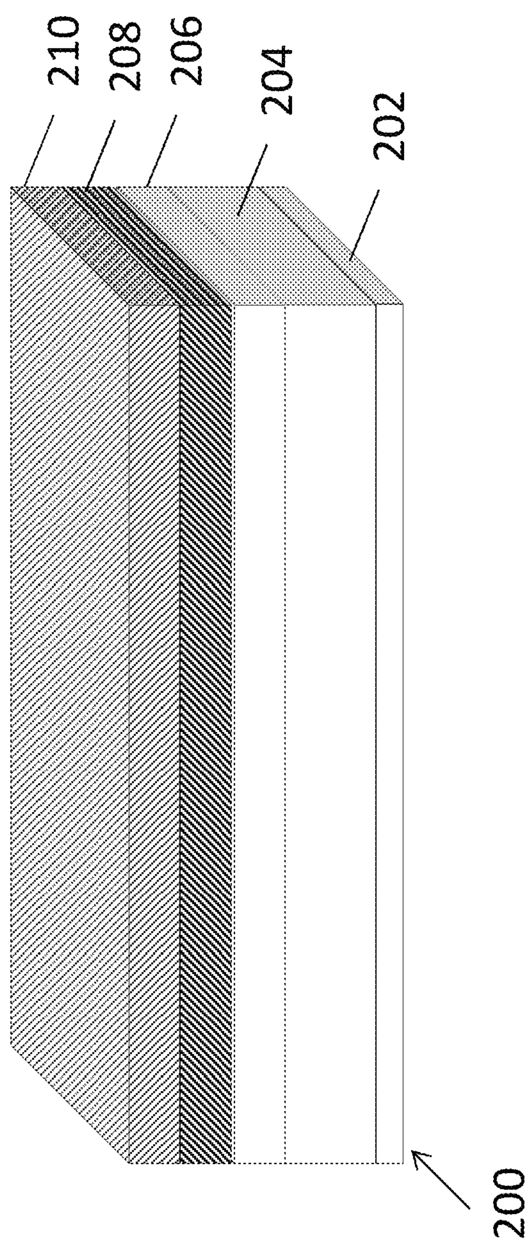
FIGS. 2-13, 14*a*, and 14*b* illustrate perspective views of an embodiment of a semiconductor device fabricated according to one or more steps of the method of FIG. 1.
Figure 3:
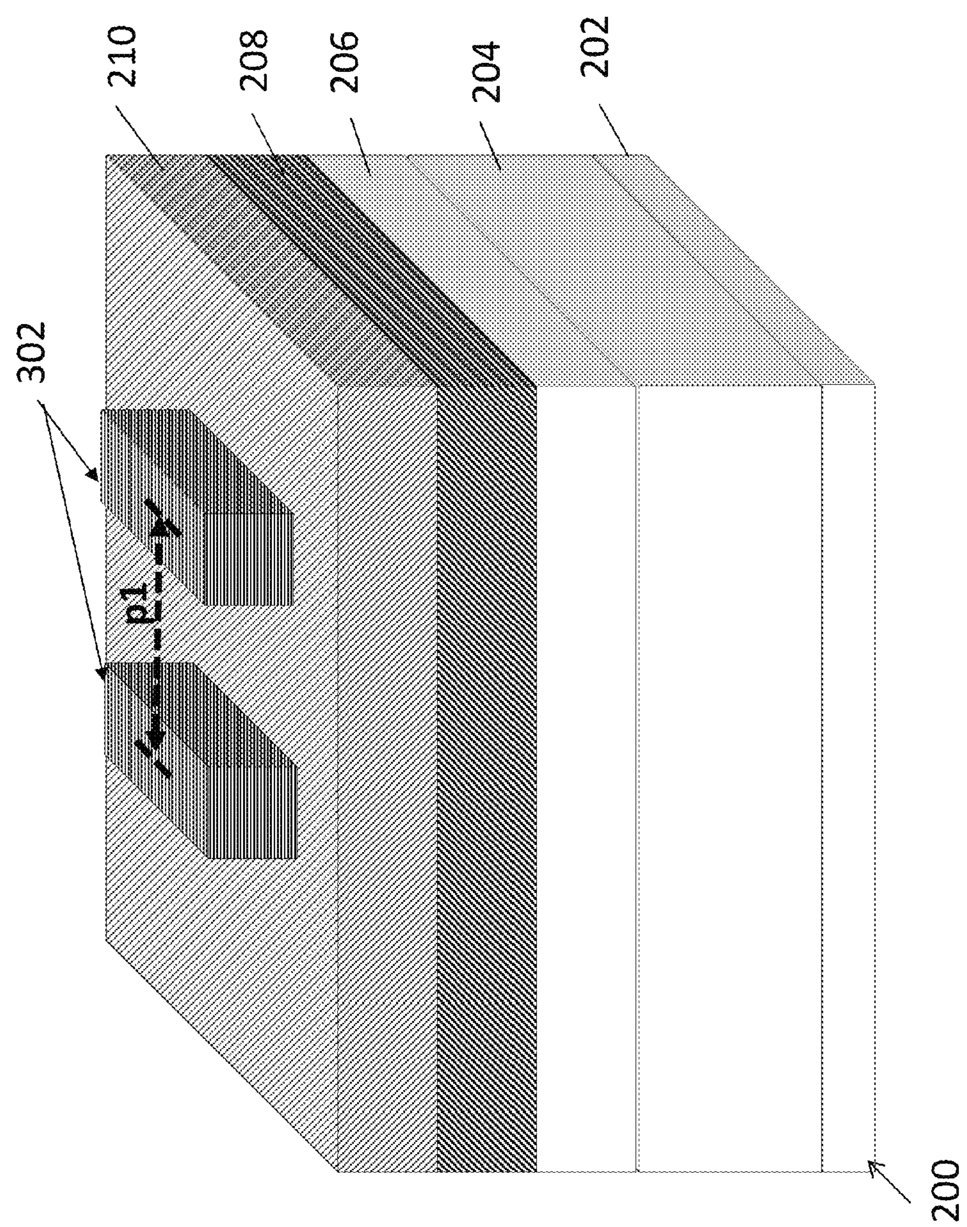
Figure 4:
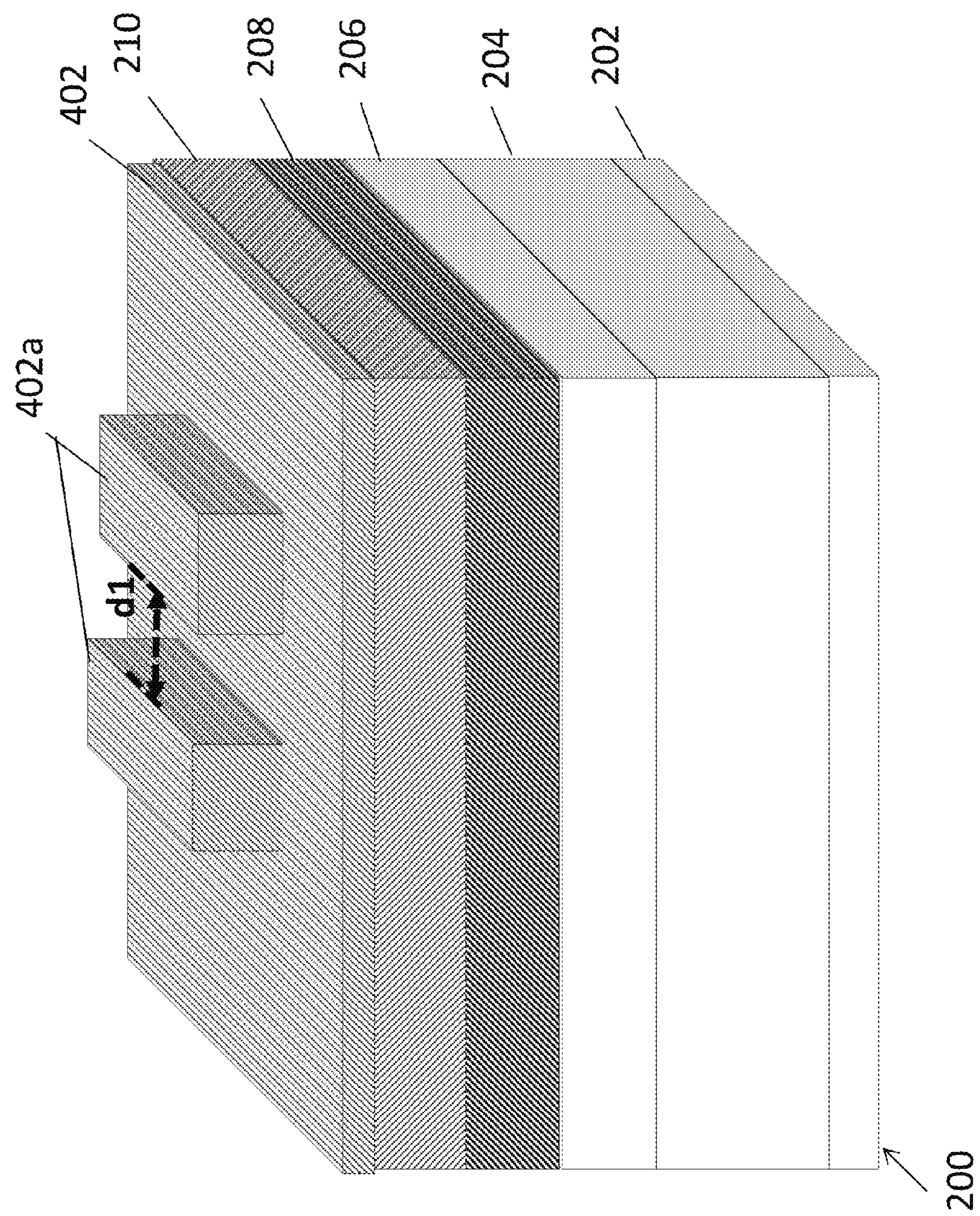

Referring to the example of FIG. 2, a substrate 200 is provided. The substrate 200 illustrates a substrate 200 having a plurality of layers formed thereon. As illustrated, substrate 200 includes base layers 202, 204, and 206; target layer 208, and anti-reflective layer 210. However, these layers are exemplary and not intended to be limiting; one or more of the layers may be omitted, and additional layers may be added. Exemplary compositions for the layers formed on the substrate 200 are provided below, however, except as specifically defined by the claims hereto, these compositions are merely exemplary and not intended to be limiting.

In an embodiment, base layer 202 includes silicon carbide. Other exemplary materials include other suitable etch stop materials such as silicon nitride. In an embodiment, base layer 204 includes a dielectric material such as a low-k or an extreme low-k dielectric material. Exemplary ELK materials include dielectric materials having a dielectric constant k less than approximately 2. The base layer 204 layer may include dielectric materials such as, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The layer may be deposited by a PECVD process or other suitable deposition technique. In an embodiment, the base layer 204 may be an interlayer dielectric (ILD) layer of a MLI structure.

In an embodiment, base layer 206 includes a dielectric material such as tetraethyl orthosilicate (TEOS). Other exemplary compositions include un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In an embodiment, the target layer 208 includes a hard mask material. In one embodiment, the target layer 208 is a hard mask material of TiN. In an embodiment, anti-reflective layer 210 includes a nitrogen-free antireflective layer (NFARL). The layers 202, 204, 206, 208, and/or 210 may be formed by suitable processes such as, for example, chemical vapor deposition (CVD) including plasma-enhanced CVD (PECVD), low-pressure CVD (LPCVD), or HDP-CVD process; spin-on coating; sputtering; physical vapor deposition (PVD); atomic layer deposition (ALD); and/or other suitable processes.

The method 100 then proceeds to block 104 where a first pattern is formed on the substrate. The first pattern may include a plurality of features. For example, the first pattern may include a plurality of features formed of photoresist. Referring to the example of FIG. 3, a first pattern 302 is disposed on the substrate 200. As illustrated, the first pattern 302 includes a first and second feature; however, any number of features and configurations may be possible. In an embodiment, the first pattern 302 includes photoresist features. The photoresist features may be formed using suitable processes such as the formation of a layer of photoresist (e.g., spin-on coating, exposure to pattern, development of the exposed photoresist, baking processes, and the like. The pattern 302 includes a pitch p1. In one embodiment, the pitch p1 is approximately 90 nanometers (nm). The first pattern 302 may define a portion of a layer of an interconnect structure to be formed on the substrate 200, as described in further detail below.

The method 100 then proceeds to block 106 where a conformal layer is formed on the substrate including on the first pattern. The conformal layer may be a spacer material, for example, used to form spacers on the sidewalls of the first and second feature as illustrated below. The conformal layer may be a dielectric material. Exemplary materials include silicon dioxide, silicon nitride, silicon oxynitride, and/or other suitable materials. Referring to the example of FIG. 4, spacer material layer 402 is formed on the substrate 200 including on the features of the first pattern 302. It is noted that the spacer material layer 402 is formed on a top surface 402*a* of the features first pattern 302. The spacer material layer 402 is also formed on the sidewalls of the first pattern 302. The first pattern 302 covered with the spacer material layer 402 provides features that are spaced a distance d1 between the spacer material formed on the sidewalls of the features.

The method 100 then proceeds to block 108 where a second pattern is formed on the substrate. The second pattern may be referred to as a cut pattern. The cut pattern may define a portion of an interconnect structure as described in further detail below. In an embodiment, the first pattern and the cut pattern both define a single layer (or level) of an interconnect structure (e.g., metal 1, metal 2).

Figure 5:
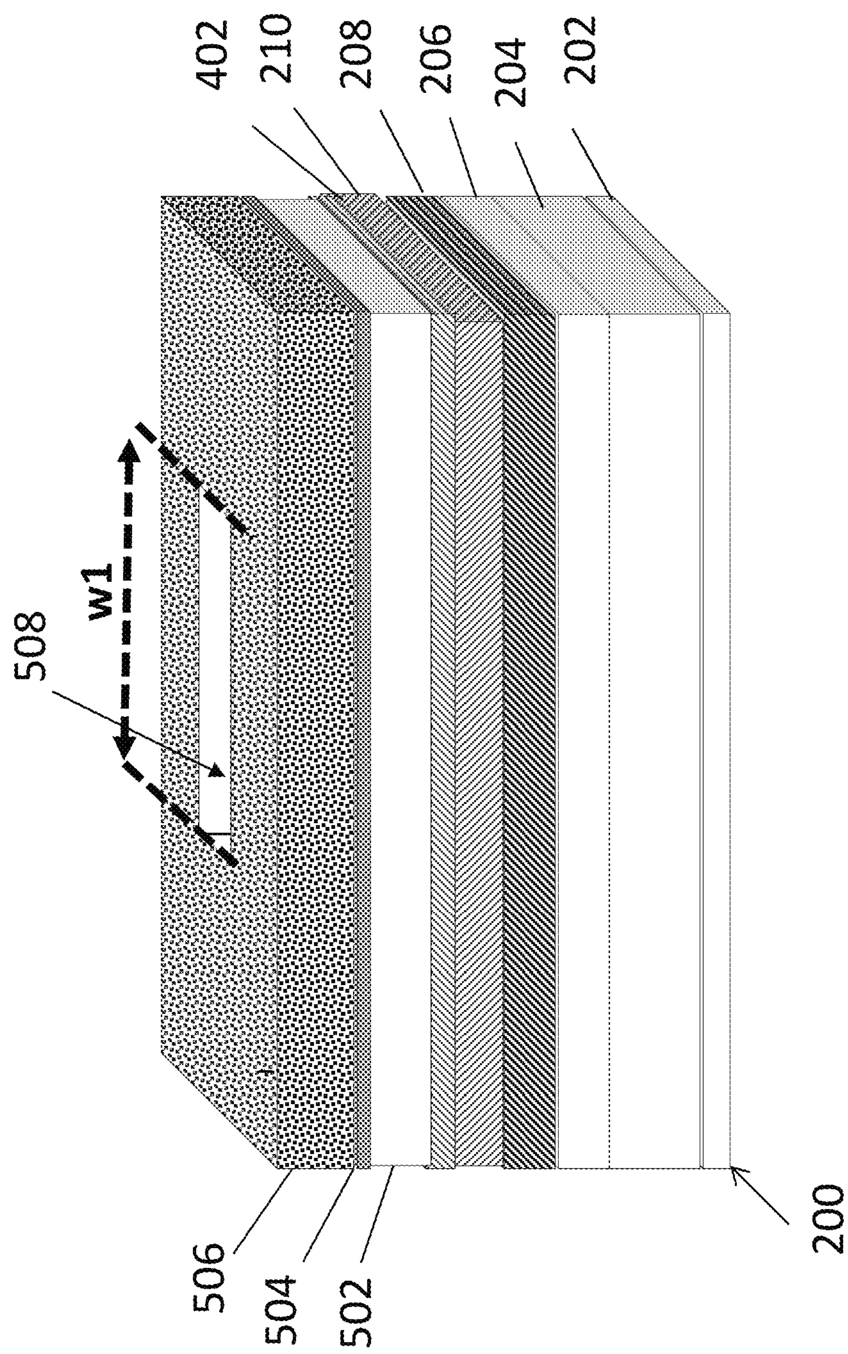

Referring to the example of FIG. 5, a second pattern 508 including an opening is formed on the substrate 200 in masking layers 504 and 506. The second pattern 508 opening may be defined by a photomask having a suitable pattern formed thereon, which is then imaged onto the photosensitive layer(s) such as layers 504 and/or 506 formed on the substrate. The opening of the second pattern 508 has a width w1. In an embodiment, the width w1 is greater than the distance d1 (see FIG. 4). In an embodiment, the width w1 is approximately 70 nm. Thus, the opening having a width w1 may overlie (vertically) at least one of the features of the first pattern 302. The opening having a width w1 may alternatively or additionally overlie the spacer material formed on the sidewalls or top (402*a*) of at least one of the features of the first pattern 302.

The second pattern 508 is then transferred to a layer 502 that is substantially coplanar with and interposes the features of the first pattern 302. In an embodiment, layer 502 is a photoresist. It is noted that the layer 502 has a top surface substantially coplanar with the top surface 402*a* of the spacer material covered features of the first pattern. The second pattern 508 may be transferred to the layer 502 in various ways. As illustrated herein, for exemplary purposes and not intended to be limiting, a tri-layer photoresist including pattern masking layers 506 and 504 are used to define the second pattern 508. The pattern masking layers 506 and 504 may include antireflective coatings (ARC), bottom ARC (BARC), photosensitive materials and/or other suitable materials, including those of a tri-layer photoresist, used to define a pattern. The defined pattern 508 may then be transferred to the layer 502 using a suitable etch process such as dry etch or plasma etch. In an embodiment, layer 502 is a bottom layer of a tri-layer photoresist including layers 504 and 506.

Figure 6:
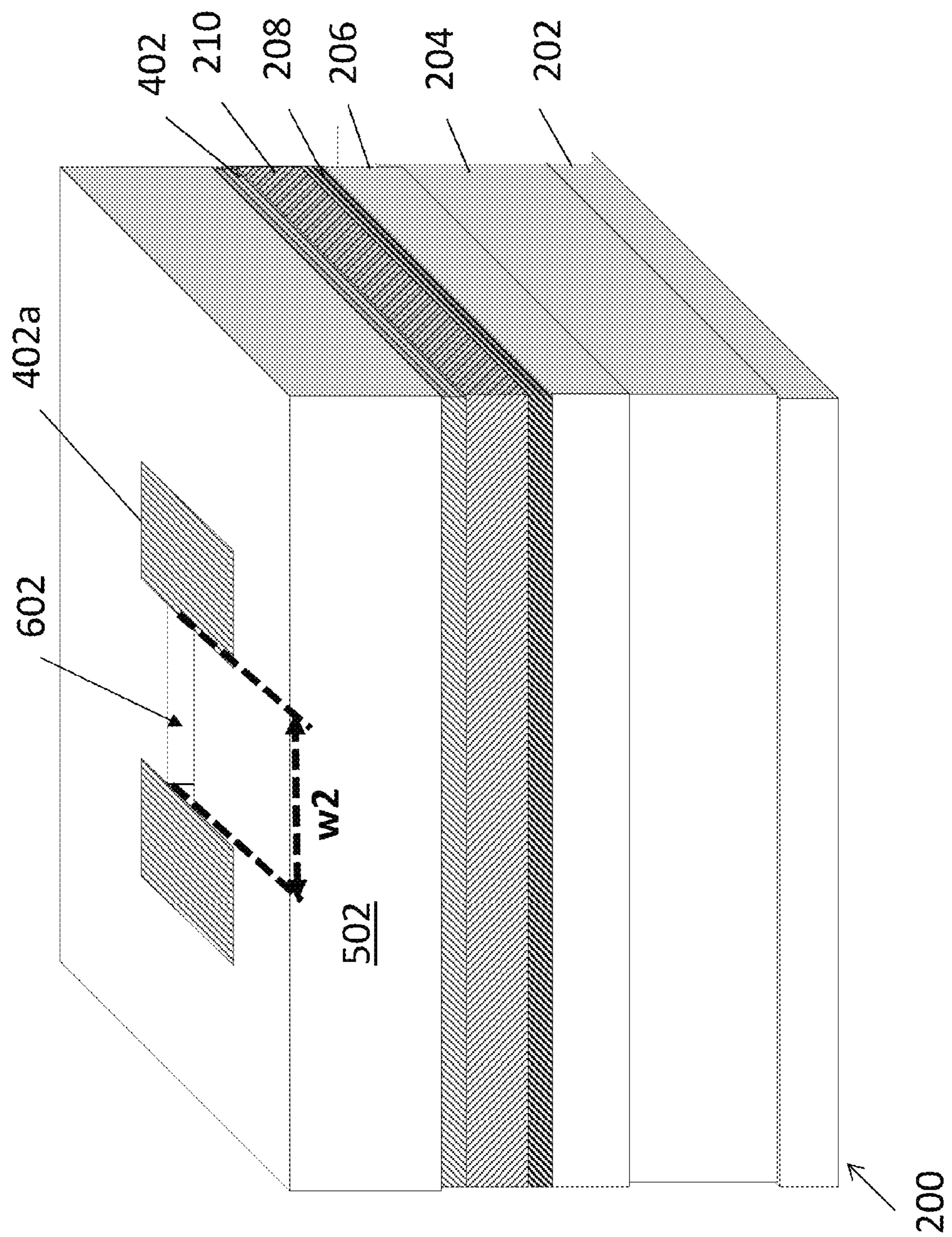
Figure 7:
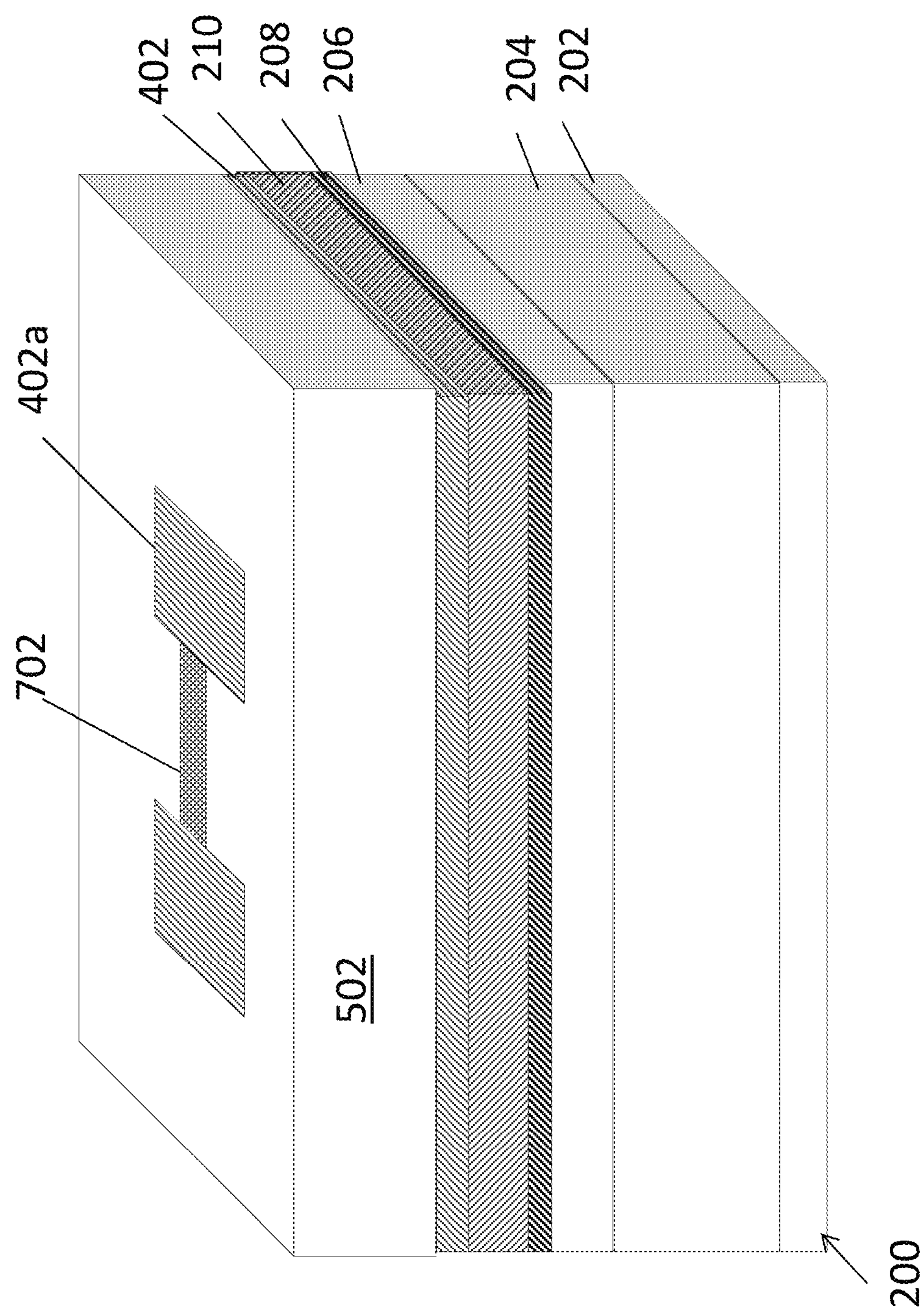
Figure 8:
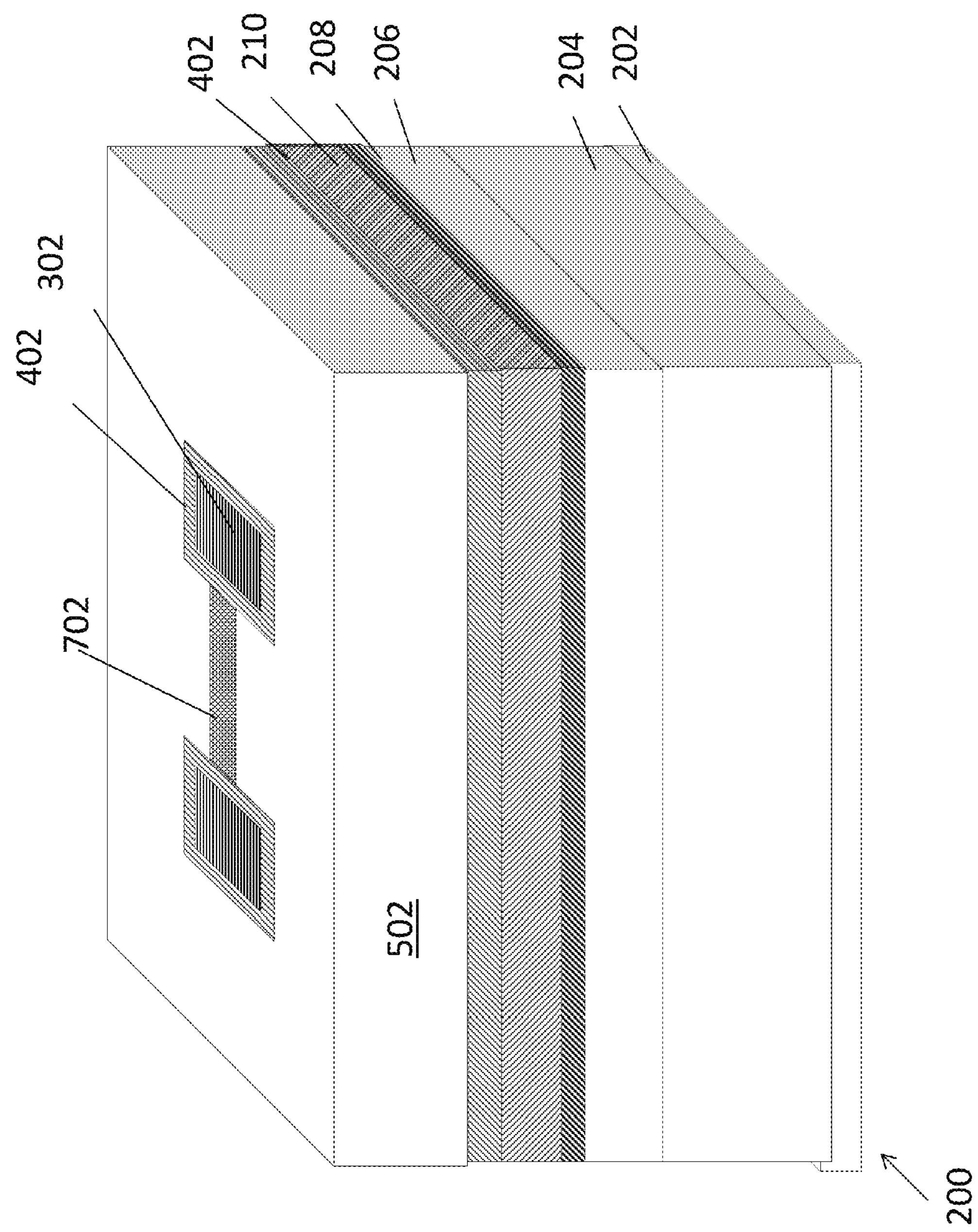

Referring to the example of FIG. 6, after the pattern has been transferred to the layer 503, the pattern masking layers 506 and 504 are subsequently stripped from the substrate. Thus, the substrate 200 includes layer 502 having an opening 602, where the opening 602 is etched using a masking element of the pattern 508. It is noted that the processing used to create the opening 602 in the layer 502 may be selective to the layer 502 such that the layer 402*a* is not substantially removed during the process. The spacer material layer 402*a* can act as an etch stop for the etching of the opening 602 in the layer 502. As described below, this may provide an advantage of allowing the opening of the pattern 508 (defined by the lithography tool) to be larger than the formed opening 602.

The opening 602 in the layer 502 has a width w2. The width w2 extends from an edge of one feature to an edge of the adjacent feature of the pattern 302 covered with spacer material 402. In other words, the opening 602 extends from the spacer material on one sidewall of a feature of the first pattern (formed above in block 104) to the spacer material on one sidewall of the adjacent feature of the first pattern. In an embodiment, the width w2 is less than the width w1 (see FIG. 5). Width w2 may be substantially equal to distance dl.

After forming the trench of the second pattern, block 108 of the method 100 continues to fill the trench with a material. In an embodiment, the trench is filed with a silicon-containing antireflective coating (Si-ARC). Exemplary Si-ARCs include inorganic ARCs such as SiON, silicon containing organic ARCs such as polysilanes, and/or other suitable compositions. In an embodiment, the silicon content is between approximately 30 and 40 atomic weight percent. The trench may be filled using a spin-coating or other suitable deposition process. Referring to the example of FIG. 7, the trench 602 (FIG. 6) is filled with material such as Si-ARC providing a filled trench 702. After filling the trench 602 an etch back process or other planarization process (e.g., etch, chemical mechanical polish, etc.) may be performed to provide a surface of the filled trench 702 that is substantially coplanar with a top surface of the layer 502 and/or the spacer material 402*a*.

Referring again to FIG. 1, the method 100 then continues to block 110 where the first pattern features are uncovered and subsequently removed from the substrate. In an embodiment, the layer in which a trench defined by the second pattern (cut pattern) is formed may also be removed. (As noted above, the trench may be subsequently filled as described in block 108.) Referring to the example of FIG. 8, a material removal process is performed to remove the spacer material from the top surface of the features of the pattern 302 (e.g., remove material 402*a*) thereby exposing the features of the pattern 302. The material removal process may include a chemical mechanical polish (CMP) process, an etch-back process such as a wet etch, dry etch, plasma etch, and/or other suitable process.

Continuing with block 110, after exposing a top surface of the features of the first pattern, the features are removed from the substrate. In an embodiment, the features of the first pattern are photoresist and are removed from the substrate using suitable stripping processes. Referring to the example of FIG. 9, the exposed features of the pattern 302 (FIG. 8) are removed from the substrate 200. The removal of the features of the pattern 302 provides openings 902 with sidewalls defined by the spacer material 402. The layer 502 is also removed from the substrate 200. The pattern 302 and the layer 502 may be removed in a single process. In an embodiment, both the pattern 302 and the layer 502 are both photoresist.

Figure 9:
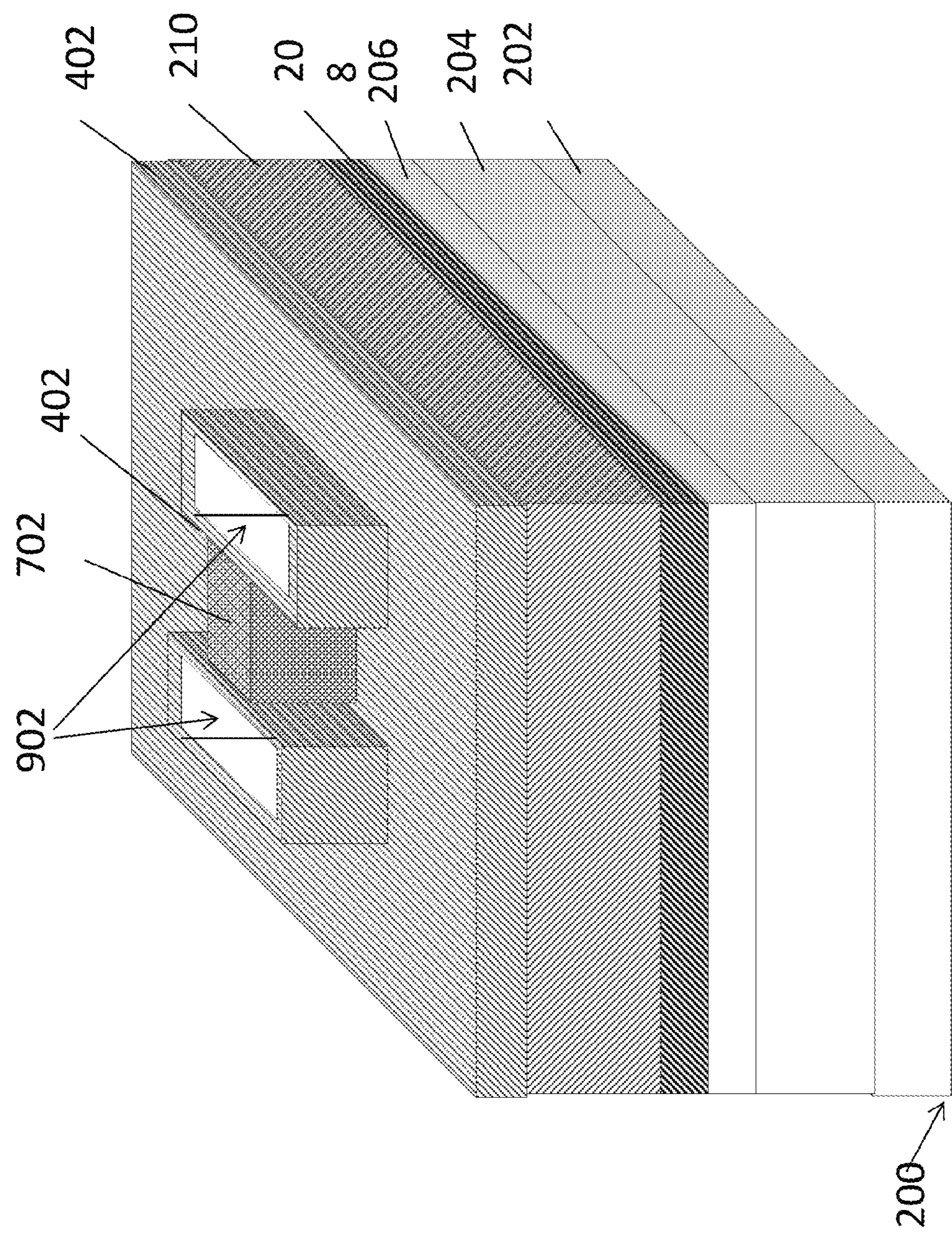
Figure 10:
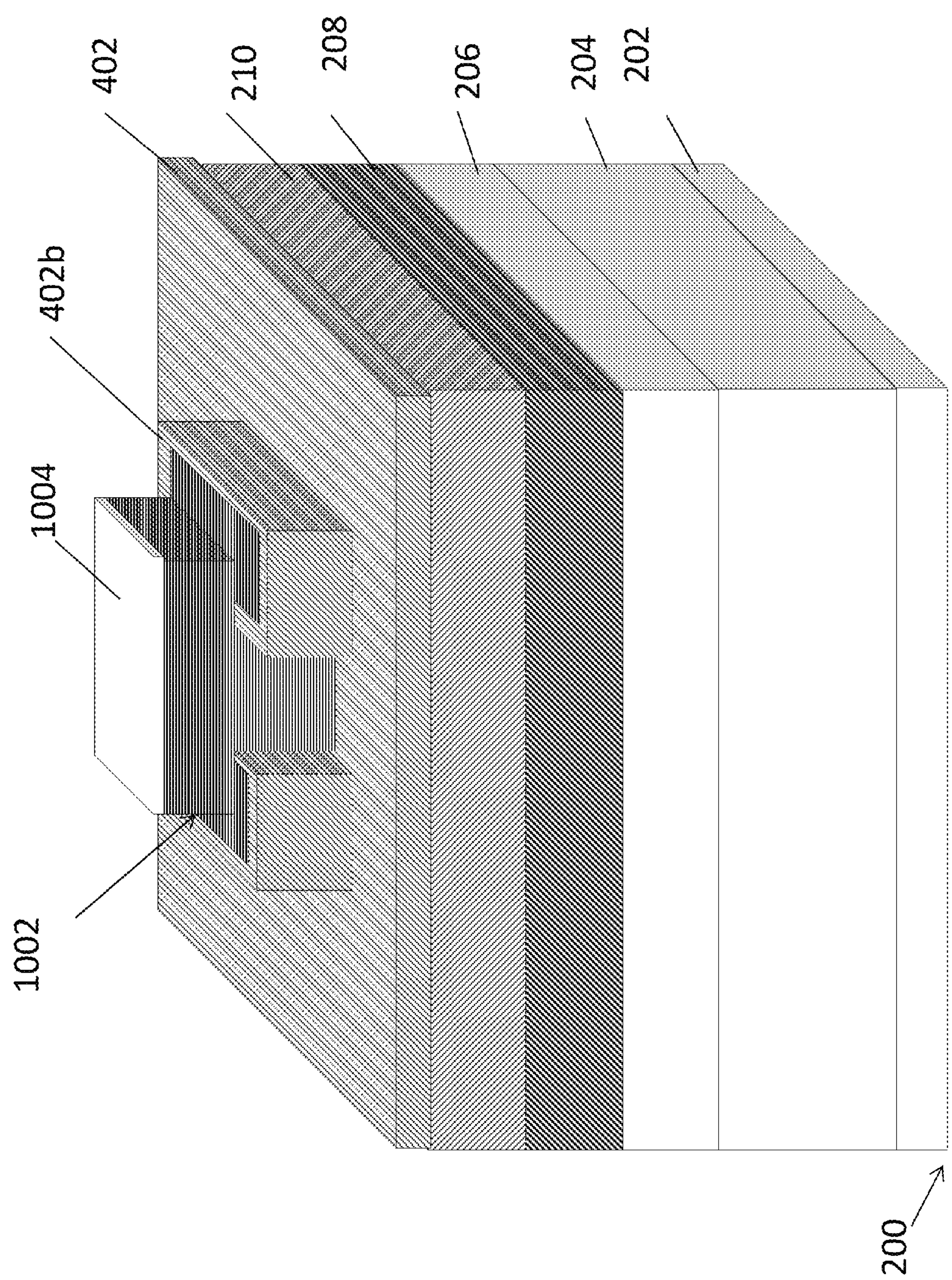
Figure 11:
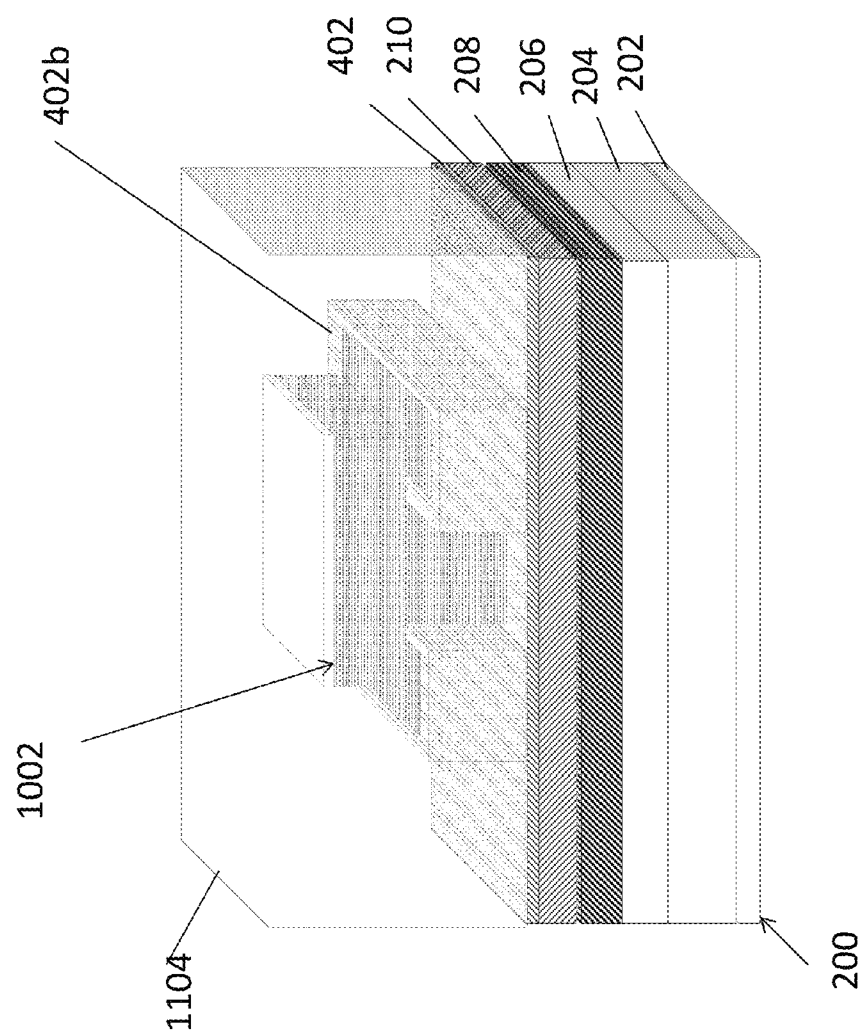
Figure 12:
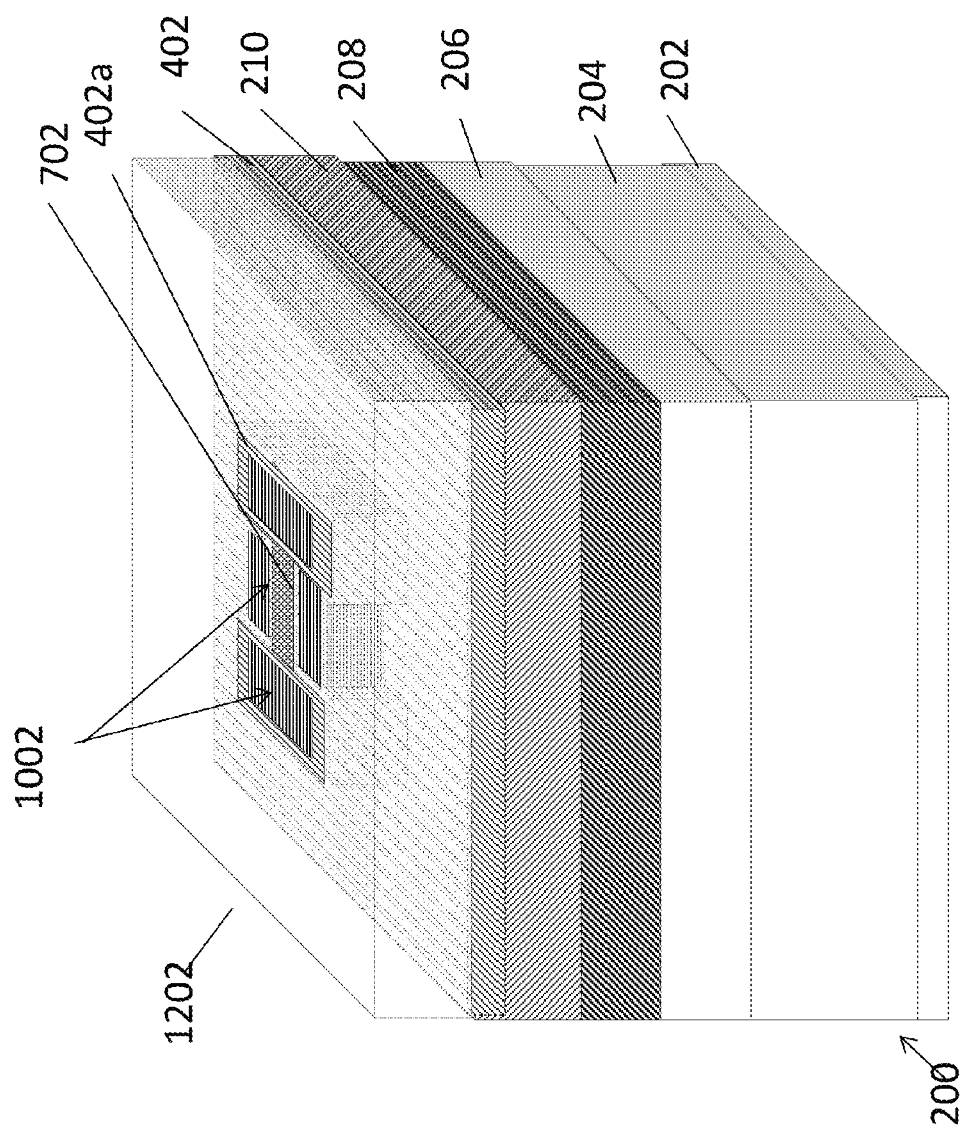

Referring again to FIG. 1, the method 100 proceeds to block 112 where a third pattern is formed on the substrate Like the first and second pattern, the third pattern may define a portion of an interconnect structure. The first, second, and/or third pattern may define a single layer or level of the interconnect structure (e.g., metal 1, metal 2). In an embodiment, the third pattern may be formed using a tri-layer photoresist material; however, other methods may also be possible and within the scope of the present disclosure. Referring to the example of FIG. 10, layers 1002 and 1004 are illustrated. In an embodiment, layer 1002 is a bottom layer of a tri-layer photoresist and layer 1004 is a middle layer of a tri-layer photoresist (top layer not being illustrated). The layer 1002 is patterned using suitable lithography techniques including spin on coating, exposure to a pattern defined by a photomask, soft baking, development, hard baking, etching, and/or other suitable processes. It is noted that the third pattern layer 1002 fills the openings 902 (FIG. 9). The third pattern of layer 1002 also is formed adjacent both sides of the filled trench 702. FIG. 10 illustrates the features of the third pattern of 1002 abutting and physically interfacing with the sidewalls of the filled trench 702.

The method 100 then proceeds to block 114 where a fill material, also referred to as a reverse material fill-in material, is formed on the substrate. In an embodiment, the fill material is a substantially similar composition as the material used to fill the trench defined by the second pattern, described above with reference to block 108. In an embodiment, the fill material is a Si-containing ARC. Referring to the example of FIG. 11, a reverse fill material 1104 is disposed on the substrate 200.

The method 100 then proceeds to block 116 where the features of the third pattern are uncovered and subsequently removed from the substrate. Referring to the example of FIG. 12, the reverse fill material 1104 is removed to provide planarized reverse fill material 1202. The planarized reverse fill material 1202 may be formed using suitable processes such as chemical mechanical polish (CMP) and/or etch back processes such as wet etch, dry etch or plasma etch. The planarized reverse fill material 1202 exposes the filled trench 702 and a top surface of the features of the third pattern formed in layer 1002 including those features filling the openings 902.

Figure 13:
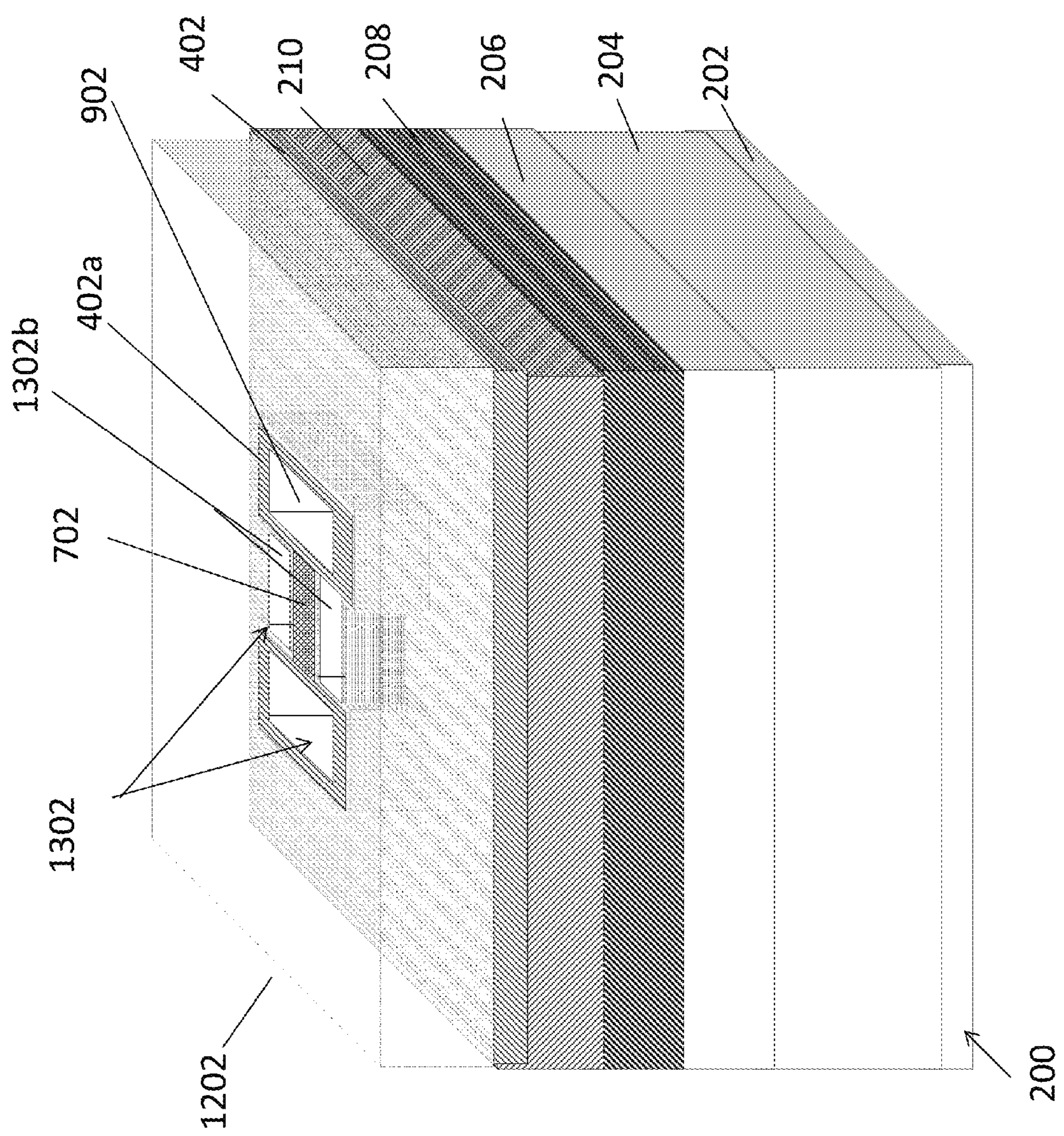
Figure 14A:
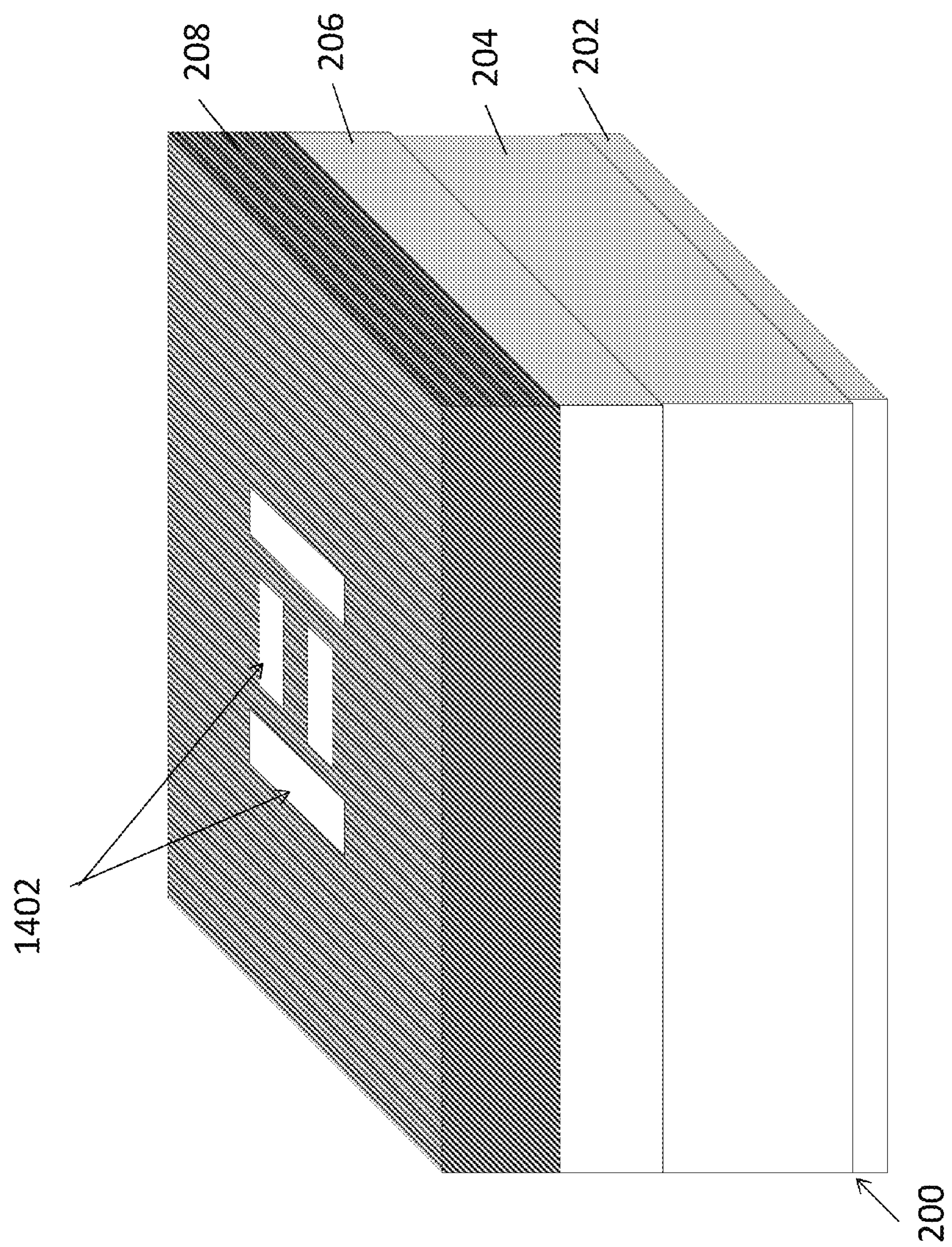
Figure 14B:
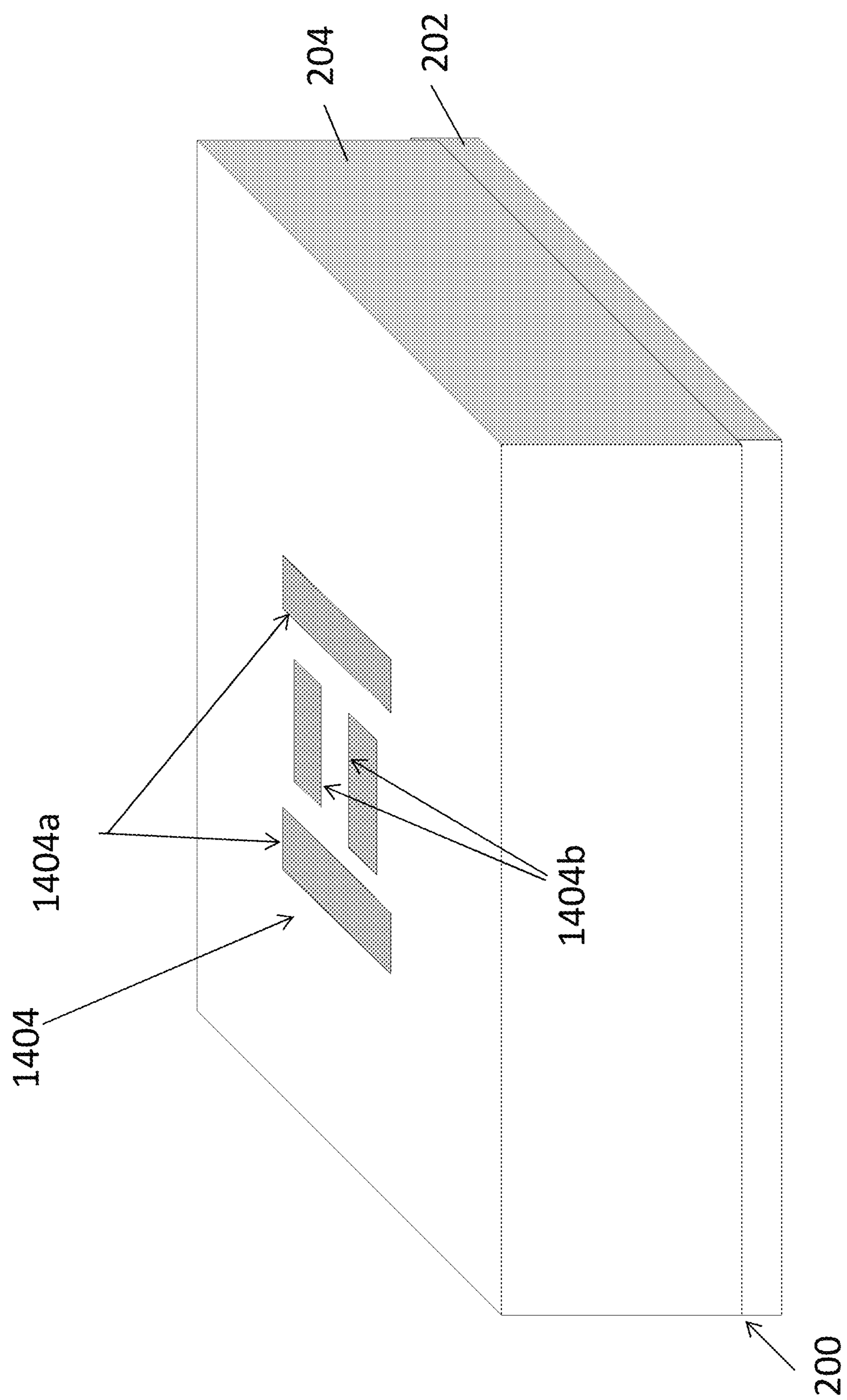

Referring to the example of FIG. 13, after exposing the features of the third pattern formed in the layer 1002, the features may be removed from the substrate 200. The features of layer 1002 formed in the openings 902 are removed. The features formed adjacent the filled trench 702 are removed creating openings 130*b*. The openings 902 and 1302*b* together are referred to as openings 1302. Thus, the openings 1302 include the openings 902 defined by the first pattern 302 and openings 1302*b* defined by the second and third pattern. The openings 1302*b* include sidewalls defined by the filled trench 702 and the spacer layer 402. The openings 902 include sidewalls defined by the spacer layer 402.

The method 100 then proceeds to block 118 where the pattern provided is transferred to an underlying layer(s). In an embodiment, one underlying layer is a hard mask layer. Referring to the example of FIG. 14*a*, the openings 1302 (FIG. 13) are used as masking elements to form openings 1402 in the hard mask layer 208. In an embodiment, the openings 1402 are substantially similar to the openings 1302.

The method 100 may continue to include transferring the pattern (e.g., openings 1402) to additional layers. In an embodiment, the pattern (e.g., openings 1402) is used to define a conductive layer (e.g., metal line) of an interconnect structure such as by a damascene or dual-damascene process. For example, the pattern defined by the method 100 (e.g., hard mask) may be transferred to an underlying layer by using the pattern as a masking element to etch trenches in a dielectric layer such as an interlayer dielectric (ILD). A conductive material may then be plated into the trenches in the dielectric layer. In an embodiment, the conductive material formed in the trenches includes copper. However, other exemplary embodiments include conductive materials such as aluminum, copper alloys, tungsten, and/or other suitable materials.

Referring to the example of FIG. 14, the pattern 1402 has been transferred to the base layer 204. In an embodiment, layer 204 is an interlayer dielectric layer (ILD). The pattern may be transferred using suitable etching processes using the openings 1402 of the layer 208 as masking elements. The etching processes may include dry etch, wet etch or plasma etch processes. After forming the trenches in the layer 204, the trenches are filled with conductive material providing an interconnect line 1404. It is noted that the features 1404*a* of the interconnect feature 1404 may be referred to as being defined by a first pattern and the features 1404*b* of the pattern 1404 may be referred to as being defined by the third pattern (as well as the second cut pattern). The features of 1404 may form a conductive line of a MLI structure.

Thus, the method 100 may be used to form conductive lines of an interconnect feature. In other embodiments, however, other features may be defined using the steps of the method 100. Embodiments of the method 100 provide benefits of forming the second (cut) pattern prior to the third pattern. Therefore, the cut pattern can have a greater overlay tolerance. For example, the cut or trench pattern can overlap the features and/or spacer material provided by the first pattern without impacting the fabricated device.

Figure 15:
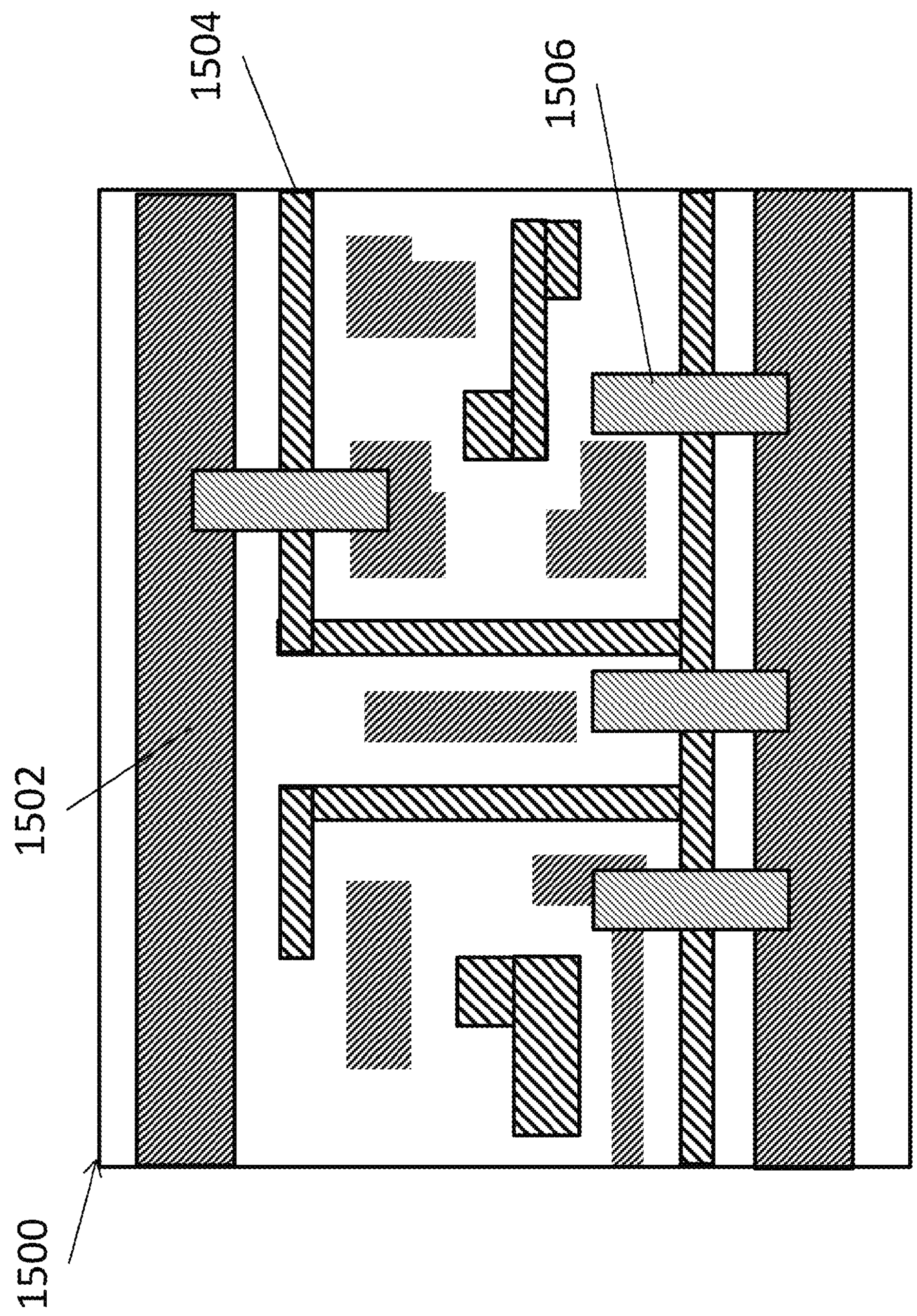
FIG. 15 illustrates an embodiment of a top view of a layout of a semiconductor device formed according to one or more aspects of the present disclosure.

Referring now to FIG. 15, illustrated is a layout 1500 of an IC device. A device associated with the layout 1500 may be fabricated using the method 100, described above with reference to FIGS. 1-13, 14*a*, and 14*b*. The layout 1500 includes a first pattern 1502. The first pattern 1502 may be substantially similar to the first pattern described above with reference to block 104 of the method 100 and/or pattern 302 of FIGS. 3-14. The layout 1500 also includes a third pattern 1504. The third pattern 1504 may be substantially similar to the third pattern described above with reference to block 112 of the method 100 and/or pattern defined by layer 1002 of FIGS. 10-13, 14*a*, and 14*b*. The first and third patterns 1502 and 1504 may define features of a metal layer of an interconnect structure, for example, the first and second patterns 1502 and 1504 may define conductive (e.g., copper) lines in one layer of a MLI of the device. The layout 1500 also includes a second pattern or cut pattern 1506. The second or cut pattern 1506 may be substantially similar to the second pattern described above with reference to block 108 of the method 100 and/or the pattern defined by opening 508 of the FIG. 5. It is noted that pattern 1506 overlaps the first pattern 1502. However, using the method 100, the features of the first pattern 1502 will not be impacted (e.g., etched) by the formation of the pattern 1506, substantially similar to as described above with reference to block 108 of the method 100. Thus, a space between lines of the second pattern 1504 may be produced without damage to the first pattern 1502. Further, this spacing may be proved without a requirement of the cut pattern 1506 being aligned and controlled such that it does not overlap the first pattern 1502.

In summary, the methods and devices disclosed herein provide for forming features using a cut pattern. In doing so, one or more embodiments the present disclosure offers several advantages over prior art devices. Advantages of the present disclosure include providing a cut pattern (e.g., second pattern as described above) that has a larger overlay margin because the boundary of the cut pattern can overlap or land on/over another feature (e.g., the spacer material on/over the sidewalls or the top surface of a feature of a first pattern). The cut pattern may also be formed using a larger size thus easing the lithography requirements of forming the pattern. It is understood that different embodiments disclosed herein offer different disclosure, and that they may make various changes, substitutions and alterations herein without departing from the spirit and scope of the present disclosure.

Thus, described herein is an embodiment of a method of forming a pattern over a semiconductor substrate. The method includes forming a first pattern on/over a semiconductor substrate having a target layer. The first pattern includes a first feature and a second feature. After forming the first pattern, a trench is formed between the first and second features. The trench is filled with a first material, thereby forming a filled trench. After filling the trench, a second pattern is formed over the semiconductor substrate. The second pattern includes a third and fourth feature. The filled trench abuts and interposes the third and fourth features. The material of the first, second, third and fourth features is removed to form a first, second, third and fourth openings. These openings are used as a masking element to pattern the target layer.

In a further embodiment, forming the first pattern includes forming the first and second features and forming a conformal layer (e.g., spacer material) over the first and second feature. The first and second features may be photoresist. The third and fourth features may also include photoresist. In an embodiment, the trench is filled a silicon-containing antireflective coating (Si-ARC) as the first material described above. In an embodiment, the trench between the first and second features is formed by depositing a photoresist layer between the first and second features and etching the trench in the photoresist layer. After forming the first and second feature and before forming the trench, a conformal layer may be formed layer over the first and second feature. After filling the trench and before forming the second pattern, the conformal layer may be removed from a top surface of the first and second feature. The first and second openings may have sidewalls defined by the conformal layer (see, e.g., element 902).

In another of the broader embodiments of a method described herein, a first pattern is formed over a semiconductor substrate; the first pattern includes a first and second feature. A masking layer (e.g., photoresist such as tri-layer photoresist, or other patternable material) is formed over the first and second features. The method continues to pattern an opening in the masking layer. The opening extends over at least one of the first and second features. The patterned opening is used to form a third feature between the first and second features. After forming the third feature, a second pattern is formed over the semiconductor substrate, wherein the second pattern includes a fourth feature and fifth feature each having an edge defined by the third feature. The first, second, fourth and fifth features are then used to pattern an underlying layer over the semiconductor substrate.

In a further embodiment, using the first, second, fourth and fifth features to pattern the underlying layer include removing the first, second, fourth and fifth features to form first, second, fourth and fifth opening, respectively and etching the underlying layer through the first, second, fourth and fifth openings. The method may also include in embodiments using the patterned underlying layer to form an interconnect structure over the semiconductor substrate. The interconnect structure (e.g., MLI or metal line of an MLI) may be defined by the first, second, fourth and fifth features.

In a further embodiment, the method includes, after forming the second pattern, forming a layer over the substrate encasing the first, second, third, fourth, and fifth features. This layer is then etched-back to expose a top surface of each of the first, second, third, fourth, and fifth features. The removal of the first, second, fourth and fifth features to form first, second, fourth and fifth openings is performed after the etching-back. The first, second, third and fourth features may include photoresist.

In another of the broader forms of the methods described herein, a method includes forming a first feature and a second feature, and each of the first and second features have spacer elements abutting the sidewalls. A first photoresist layer is formed over the first and second features and spacer elements. An opening is patterned in the first photoresist layer; the opening extends over at least one of the spacer elements. This patterned opening is used to form a trench in a second photoresist layer between the first and second features having spacer elements. The trench has a first end having a physical interface with the spacer element of the first feature and a second opposing end having a physical interface with the spacer element of the second feature. After forming the trench, a third feature and a fourth feature are concurrently formed. The trench has a first side having a physical interface with the third feature and a second, opposing side having a physical interface with the fourth feature. The first, second, third and fourth features are used to pattern an interconnect structure of a semiconductor device.

In a further embodiment, the interconnect structure patterned is a copper metal line. In an embodiment, each of the first, second, third and fourth features include a photoresist material. In a further embodiment, using the first, second, third and fourth features to provide a pattern includes stripping the photoresist material to form respective openings and using the respective openings to etch a hard mask layer.

In a further embodiment, the opening in the first photoresist layer extends over at least one of the first and second features. After forming the first and second features, the second photoresist layer may be formed over the substrate interposing the first and second features. A top surface of the second photoresist layer may be is substantially coplanar with a top surface of the first feature. The first photoresist layer is then formed over the second photoresist layer.

What is claimed is:

1. A method, comprising:

forming a trench over a layer disposed on a semiconductor substrate filling the trench with a first material, thereby forming a filled trench over the layer;

forming a feature of a second material over the filled trench, wherein the feature is disposed over the filled trench and extends along two opposing sidewalls of the filled trench to a top surface of the layer;

planarizing the feature to expose a top surface of the filled trench, wherein the planarizing provides a first portion of the feature adjacent a first sidewall of the two opposing sidewalls of the filled trench and a second portion of the feature adjacent a second sidewall of the two opposing sidewalls of the filled trench; and using the first and second portions of the feature to define a dimension of an interconnect feature disposed over the semiconductor substrate.

2. The method of claim 1, further comprising:

forming first and second features over the layer, wherein the trench extends between the first and second feature; and using the first and second features to define another dimension of the interconnect feature disposed over the semiconductor substrate.

3. The method of claim 2, wherein the first and second features include photoresist.

4. The method of claim 1, wherein the forming the feature of the second material includes depositing photoresist.

5. The method of claim 1, wherein the filling the trench with the first material includes depositing a silicon-containing antireflective coating (Si-ARC).

6. The method of claim 1, wherein the filling the trench with the first material includes depositing at least one of SiON and a polysilane.

7. The method of claim 1, wherein forming the trench includes:

forming first feature and second features over the layer;

depositing a sacrificial layer between the first and second features and etching the trench in the sacrificial layer.

8. The method of claim 6, wherein the sacrificial layer includes photoresist.

9. The method of claim 6, further comprising:

after forming the first and second features and before forming the trench, forming a conformal layer over the first and second features.

10. A method, comprising:

forming a first feature and a second feature having a trench extending therebetween on a semiconductor substrate;

filling the trench with a material;

forming a third feature and a fourth feature each on opposing sides of the filled trench and each having an edge defined by the filled trench; and using the first, second, third and fourth features to pattern an underlying layer over the semiconductor substrate.

11. The method of claim 10, wherein the using the first, second, third and fourth features to pattern includes:

removing the first, second, third and fourth features to form first, second, third and fourth openings.

12. The method of claim 11, wherein the using the first, second, third and fourth features to pattern includes:

etching the underlying layer through the first, second, third and fourth openings.

13. The method of claim 10, further comprising:

using the patterned underlying layer to form an interconnect structure over the semiconductor substrate, wherein the interconnect structure is defined by the first, second, third and fourth features.

14. The method of claim 10, further comprising:

after forming the third and fourth features, forming a layer over the substrate encasing the first, second, third, and fourth features; and etching-back the layer to expose a top surface of each of the first, second, trench, third and fourth features.

15. The method of claim 14, further comprising:

removing the first, second, third and fourth features to form the first, second, third and fourth openings after the etching-back; and etching the underlying layer through the first, second, third and fourth openings.

16. The method of claim 10, wherein the first, second, third and fourth features are photoresist.

17. A method, comprising:

forming a first feature and a second feature over a substrate, wherein each of the first and second features has spacer elements abutting its sidewalls;

forming a trench having a first end and an opposing second end and a first sidewall and an opposing second sidewall, and wherein the trench extends between the first and second features such that the first end has an interface with the spacer element of the first feature and the opposing second end has an interface with the spacer element of the second feature;

after forming the trench, forming a third feature and a fourth feature, wherein the first sidewall of the trench has an interface with the third feature and the opposing second sidewall of the trench has an interface with the fourth feature; and using the first, second, third and fourth features to pattern a structure of a semiconductor device.

18. The method of claim 17, wherein the structure is an interconnect structure.

19. The method of claim 17, wherein the using the first, second, third and fourth features to pattern the structure includes removing the features to form respective openings and using the respective openings to etch an underlying layer.

20. The method of claim 17, wherein the forming the trench includes:

forming a patterning material over the first and second feature;

forming an opening in the patterning material; and etching the trench through the opening in the patterning material.

* * * * *